United States Patent [19]
Ritoniemi et al.

[11] Patent Number: 5,629,701
[45] Date of Patent: May 13, 1997

[54] CASCADED NTH ORDER (N>2) FEEDFORWARD SIGMA-DELTA MODULATORS

[75] Inventors: Tapani Ritoniemi, Insinöörinkatu 84 B 31, FIN-33720 Tampere, Finland; Teppo Karema, Pori; Hannu Tenhunen, Tampere, both of Finland

[73] Assignee: Tapani Ritoniemi, Tampere, Finland

[21] Appl. No.: 256,567

[22] PCT Filed: Jan. 28, 1993

[86] PCT No.: PCT/FI93/00027

§ 371 Date: Aug. 11, 1994

§ 102(e) Date: Aug. 11, 1994

[87] PCT Pub. No.: WO93/15557

PCT Pub. Date: Aug. 5, 1993

[30] Foreign Application Priority Data

Jan. 28, 1992 [FI] Finland ................... 920378

[51] Int. Cl.⁶ .................................................. H03M 3/00
[52] U.S. Cl. .................................................. 341/143
[58] Field of Search .................................................. 341/143

[56] References Cited

U.S. PATENT DOCUMENTS

| | | | |
|---|---|---|---|
| 4,862,169 | 8/1989 | Van Bavel et al. | 341/143 |
| 4,920,544 | 4/1990 | Endo et al. | 341/143 |
| 5,055,846 | 10/1991 | Welland | 341/143 |
| 5,153,593 | 10/1992 | Walden et al. | 341/143 |
| 5,442,354 | 8/1995 | Cabler | 341/143 |

FOREIGN PATENT DOCUMENTS 0368610  5/1990  European Pat. Off. .

OTHER PUBLICATIONS

"A 16-bit Oversampling A-to-D Conversion Technology Using Triple-Integration Noise Shaping", Matsuya et al, pp. 921–929, IEEE Journal of Solid State Circuits, vol. SC.22, Dec. 1987.

Ritoniemi et al., *A Fifth order sigma-delta modulator for audio A/D converter*, IEE International Conference on Analogue to Digital and Digital to Analogue Conversion, pp. 153–158, Swansea, UK Sep. 1991.

*Primary Examiner*—Howard L. Williams
*Attorney, Agent, or Firm*—Bell, Seltzer, Park & Gibson, P.A.

[57] ABSTRACT

The invention relates to a method for cascading two or more feedforward-type sigma-delta modulators, and a modulator system comprising at least two cascaded modulators (1, 2). According to the invention, each subsequent modulator (2) in the cascade quantizes the integrated signal estimate error (e) of the preceding modulator (1), the quantized error (e') is differentiated (3) and subtracted (6) from the quantized output signal (D") of the preceding modulator (1).

9 Claims, 2 Drawing Sheets

CASCADED NTH ORDER (N>2) FEEDFORWARD SIGMA-DELTA MODULATORS

FIELD OF THE INVENTION

The invention relates to a method for cascading at least two sigma-delta modulators, wherein an error of one modulator in the cascade is quantized by the next modulator in the cascade; the quantized error is differentiated; and the differentiated error is subtracted from the quantized output signal of said one modulator.

BACKGROUND OF THE INVENTION

In sigma-delta modulators (also known as delta-sigma modulators), the signal is quantized by using only a small number of quantization levels (2–256, which corresponds to an A/D converter with a resolution of 1 to 8 bits) at a high rate, usually 32–512 times the signal frequency. The ratio between the Nyquist sampling frequency (two times the useful signal band) and the used high sampling frequency is also called oversampling ratio (M). A quantizer is a combination of an A/D and a D/A converter, in which an analog signal is converted by the A/D converter to a discrete digital value which is then immediately converted back to an analog voltage (value) by the D/A converter. A quantizing error ($e_k$) is the difference voltage (value) between the analog input voltage and the analog output voltage, and the quantizing noise is the spectrum ($Q_e$) of the quantizing error; in the case of the sigma-delta modulator, the quantizing noise can be regarded as white noise. The effective value (E) of the white noise in a one-bit quantizer is $(q/2)^2$ with a one-bit, where q is the spacing between the quantization levels. A sigma-delta modulator configuration is such that the quantizer error transfer function (NTF) to the output of the modulator is different from the signal transfer function (STF) from the input to the output of the modulator. The object is to provide a quantizing error transfer function NTF with the highest possible attenuation within a desired passband while the signal transfer function STF is as uniform as possible over the whole passband. The STF and NTF are interdependent in a manner determined by the used modulator structure. The order of the modulator is the order of the NTF function, or the number of integrators in the modulator. By increasing the order of the modulator the amount of quantizing noise in the passband can be decreased. Another way of decreasing the amount of quantizing noise in the passband is to increase the oversampling ratio however, an increase in the oversampling ratio increases the sampling frequency which in turn is limited by the components used in the implementation. Therefore the only way to improve the ratio ($S/N_q$) between the signal (S) and the quantizing noise ($N_q$) in the passband is to increase the order of the modulator or to improve the NTF so that the attenuation in the passband is increased while the order of the modulator and the oversampling ratio remain unchanged.

A conventional sigma-delta modulator with directly series-connected integrators is, however, difficult to implement due to the oscillation caused by the feedback loop. Therefore higher-order sigma-delta modulators have been formed by cascading two or more stable lower-order sigma-delta modulators. The quantizing error of the first modulator in the cascade connection (the difference between the input and output signals of the quantizer) is applied to the second modulator in the cascade, and the amount of quantizing noise over the signal band can be decreased by suitably interconnecting the outputs of the blocks. A 16-bit *Oversampling A-to-D Conversion Using Triple-Integration Noise Shaping*, IEEE Journal of Solid State Circuits, Vol. SC-22, No. 6, December 1987, p. 921 to 929, describes the cascading of first-order sigma-delta modulators by the so-called MASH technique. FI Patent 80548 describes the cascade connections of second-order multiple-feedback modulators.

SUMMARY OF THE INVENTION

The object of the present invention is to cascade two sigma-delta modulator blocks to achieve a better SNRQ than what was possible in the prior art modulator system of the same order and with the same oversampling ratio.

This is achieved by a method described in the introductory chapter, which according to the invention is characterized in that the error is the error of the integrated signal estimate of said one modulator.

According to the invention, at least two nth-order sigma-delta modulator blocks realized by a 1-bit quantizer are cascaded so that each subsequent modulator block quantizes 1-bit the signal estimate error voltage formed in the preceding modulator block, scaled by a scalar 1/C to the operating range of the subsequent modulator. The 1-bit data of the subsequent modulator block is filtered by a digital filter having a transfer function which is the inverse of the transfer function of the integrators of the first modulator block, and scaled by a scalar C, and then subtracted from the 1-bit data of the first block, which data has been delayed in an amount corresponding to the delay caused by the subsequent modulator block. In this way the signal estimate error of the first block, quantized by the subsequent modulator block, can be subtracted from the output of the first block, and the accuracy of the signal estimate is improved and the amount of quantizing noise on the signal band is reduced. The obtained digital output is the output of a 2*nth-order sigma-delta modulator. As distinct from the prior art cascading based on the re-quantization of the quantizing error, the cascading according to the invention based on the signal estimate error ensures that the signal transfer function of the entire modulator system will always be 1 irrespective of the coefficients (STF) of the used modulator block. The prior art re-quantization of the quantizing error and the substraction of the error from the output of the first block linearizes the attenuation across the quantizer to a constant value (1), so that the signal transfer function is determined by the STF of the first modulator block.

The modulator blocks used in the invention are of the FF-type. According to the invention the blocks are at least of the second order. The STF of the two blocks must be equal. As the first feedforward-type modulator has a single feedback for the quantized value (from the output to the input), the signal estimate error is the voltage difference between the feedbacked quantized signal (voltage) and the analog input voltage. However, the signal estimate error is integrated n times (n is the number of the integration stages) before it is applied to the subsequent (next) modulator. In addition, it is possible to subtract an appropriately weighted signal estimate (a 1-bit quantized voltage) from the signal estimate error.

In addition to the advantages of the higher-order modulator system and the associated reduction in the amount of quantizing noise, the cascade connection can improve the signal-to-noise ratio ($S/N+N_q$) in practical applications, because the required voltage scaling in the input of the first modulator block is smaller than in the prior art cascaded modulators. The sensitivity of the modulator to the noise (N) of the circuit elements is at highest in the input stage, and so the performance of nearly all modulators (with an accuracy higher than 16 bits) is limited by the noise of the circuit elements of the first integrator. With less voltage scaling the physical noise (N) of the circuit elements is relatively smaller.

The invention also relates to a sigma-delta modulator system comprising a first sigma-delta modulator having at least two integration stages and a quantizing means for quantizing a primary signal; a means for providing an error signal representing the quantizing noise of the first modulator; a second sigma-delta modulator means having at least two integration stages and a quantizing means, for quantizing said error signal; a differentiation means having a transfer function substantially equal to the inverse function of the common transfer function of the integration stages of the first modulator means, for differentiating the output signal of the second modulator means; a means for delaying a quantized primary signal in an amount corresponding to the delay of the second modulator means; and a means for subtracting the differentiated error signal from the delayed quantized primary signal.

BRIEF DESCRIPTION OF THE DRAWINGS

In the following the invention will be described in greater detail by means of illustrating embodiments with reference to the attached drawing, in which.

DETAILED DESCRIPTION OF THE INVENTION

The present invention has a special range of applications in oversampled A/D converters. Oversampling generally means that the sampling frequency Fs is substantially higher than the lowest sampling frequency determined by the Nyquist criterion, which is two times the highest frequency of the signal. The sampling frequency usually applied in oversampling is an integer multiple of the Nyquist frequency, e.g. 32 or 64 (oversampling ratio).

However, the invention is applicable in any applications utilizing a higher-order sigma-delta modulator.

Figure 1:
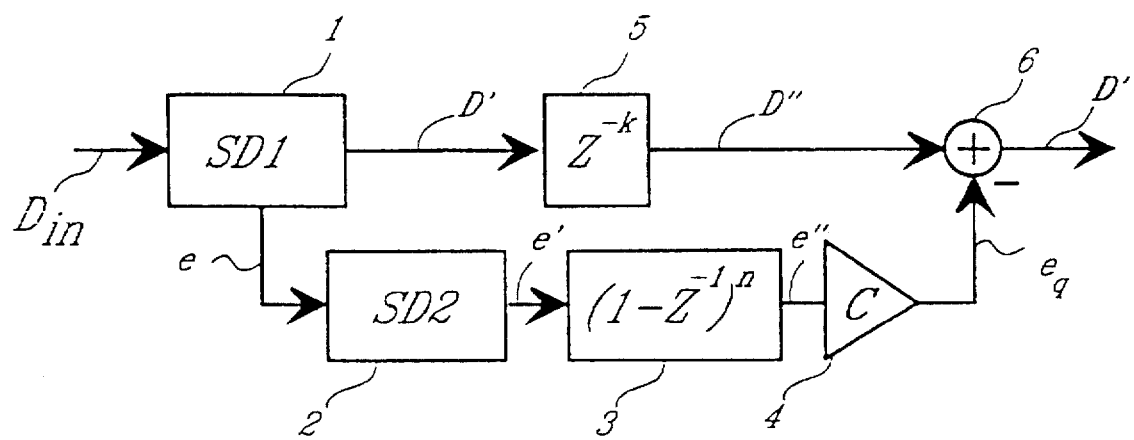
FIG. 1 is a block diagram illustrating an nth-order sigma-delta modulator system according to the invention.

FIG. 1 illustrates generally the cascading of two nth-order modulators SD1 and SD 2 according to the invention, but it is equally possible in the invention to cascade several modulators in the same way. An input signal Din to be quantized is applied to a first modulator block SD1, which produces a quantized 1-bit output signal D', which is delayed in a delay block 5 by a delay $z^{-1}$, and the delayed quantized signal D" is applied to one input in a subtractor means 6. An integrated signal estimate error e of the modulator block SD1 is first scaled by a coefficient 1/C and then applied to the second modulator block SD2, which produces a quantized error signal e'. The signal e' is differentiated by a digital filter block 3 forming a differentiator, the transfer function $(1-z^{-1})^n$ of the filter block 3 being substantially equal to the inverse function of the common transfer function of the integration stages of the modulator block SD1. The differentiated and quantized error signal e" is scaled by a coefficient C (the reciprocal of 1/C), and the scaled error signal $e_q$ is applied to another input in the subtractor means 6. As a result, the quantized error signal $e_q$ is subtracted from the delayed quantized primary signal D", so that only the 2*nth-order quantizing noise of the modulator block SD2, differentiated n times, is retained in the output signal D' of the system.

In practice, it is preferable that the modulator blocks SD1 and SD2 are of the same order and have the same coefficient values. If the modulator blocks SD1 and SD2 are not of the same order or have not the same number of delays, the digital filter block 3 is difficult to implement as not only the FIR differentiator but also the IIR part has to be realized by it. Therefore the cascading of modulator blocks SD1 and SD2 of unequal order is a less interesting application. Accordingly, in the preferred embodiments of the invention, the order n of the differentiator realized by the block 3 is equal to the order of the modulator blocks SD1 and SD2, and it eliminates the effect of the common transfer function of the interations of the modulator block SD1 on the quantized error signal e'. The delay k of the delay block 5 has to be equal to the delay of the modulator block SD2, that is, the combined delay of its integrators. In the practical implementation the delay k consists of a number of clock periods equal to the order n of the modulator block SD1, that is, n=k. The error signal is scaled by a coefficient 1/C, and so the voltage of the error signal will fall within the linear operating range of the block SD2. Thereafter the digital output of the block SD2 is scaled by the coefficient C so that the original signal level will be restored. The minimum value of the coefficient C is the ratio between the modulator coefficients $b_n/b_1$. The system, however, is operative even at higher scaling coefficients C, although the SNRQ deteriorates with the increasing coefficient.

Nth-order feedforward modulator structures will be described below as illustrating embodiments, which can be used as the blocks SD1 and SD2 in the modulator system according to the invention.

Figure 2:
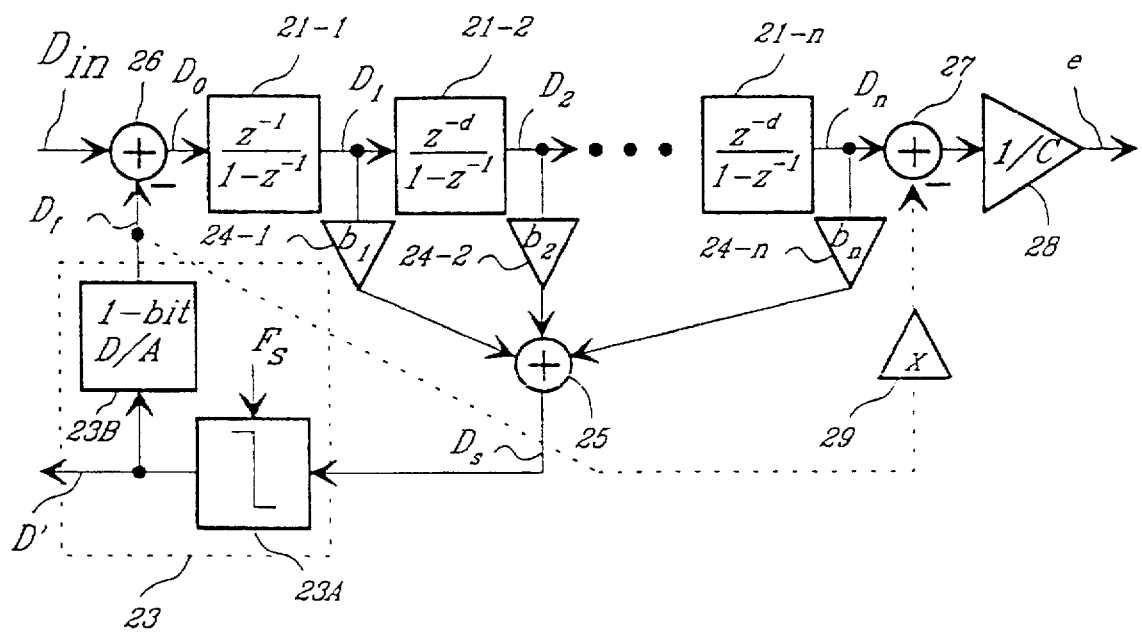
FIG. 2 is a block diagram illustrating an nth-order feedforward modulator based on the connecting of an integrated signal estimate error and suitable for use as a modulator block SD1 in FIG. 1.

FIG. 2 shows a feedforward modulator structure suitable for use as SD1, comprising a series connection of a subtractor 26 and n integration stages 21-1 ... 21-n in this order. The output voltage $D_1$-$D_{nN}$ Of each integration stage 21-1 ... 21-n is connected through a respective scaling means 24-1 ... 24-n (each voltage being scaled by a respective coupling coefficient b1-bn) to a summing means 25, which combines the scaled voltages $D_1$-$D_n$ and applies the sum voltage Ds to a quantizer 23. The quantizer 23 is a combination of an A/D and a D/A converter, in which the analog voltage Ds is converted by the A/D converter 23A to a discrete digital value D', which is the output signal of the modulator SD1 and which is immediately thereafter converted back to an analog voltage Df (value) by the D/A converter 23B so as to establish a negative feedback from the output of the quantizer 23 to the input of the modulator SD1. For this purpose the quantized output signal D', that is, the signal estimate, is converted by the D/A converter 23B into an analog voltage Df and then applied to one input in the subtractor 26 to be subtracted from the input voltage Din applied to the integration stage 21-1. The difference voltage DO between the voltages Din and Df is the signal estimate error.

The output voltage of the last integration stage 21-n, that is, the integrated signal estimate error Dn may be the error voltage e applied to the next modulator stage SD2 when scaled by the coefficient 1/C in a scaling means 28. In such a case the modulator does not comprise a subtractor 27 and a scaling means 29.

Alternatively, it is possible to use a subtractor 27 to one input of which the output voltage of the integration stage 21-n is applied. The output signal D' of the quantizer 23 is weighted (after having been converted into an analog voltage by the A/D converter 23B) by a scaling coefficient x (where $0<x<4*b1/b2$) in the scaling means 29 and further applied to another input in the subtractor 27 (as shown by the broken lines) so as to be subtracted from the voltage Dn, that is, from the integrated signal estimate error to obtain their difference voltage e, which is preferably scaled in a scaling means 28 by a scaling coefficient 1/C smaller than one (at least $b_n/b_1$) to decrease the signal level to the operating range of the next modulator block SD2.

Figure 3:
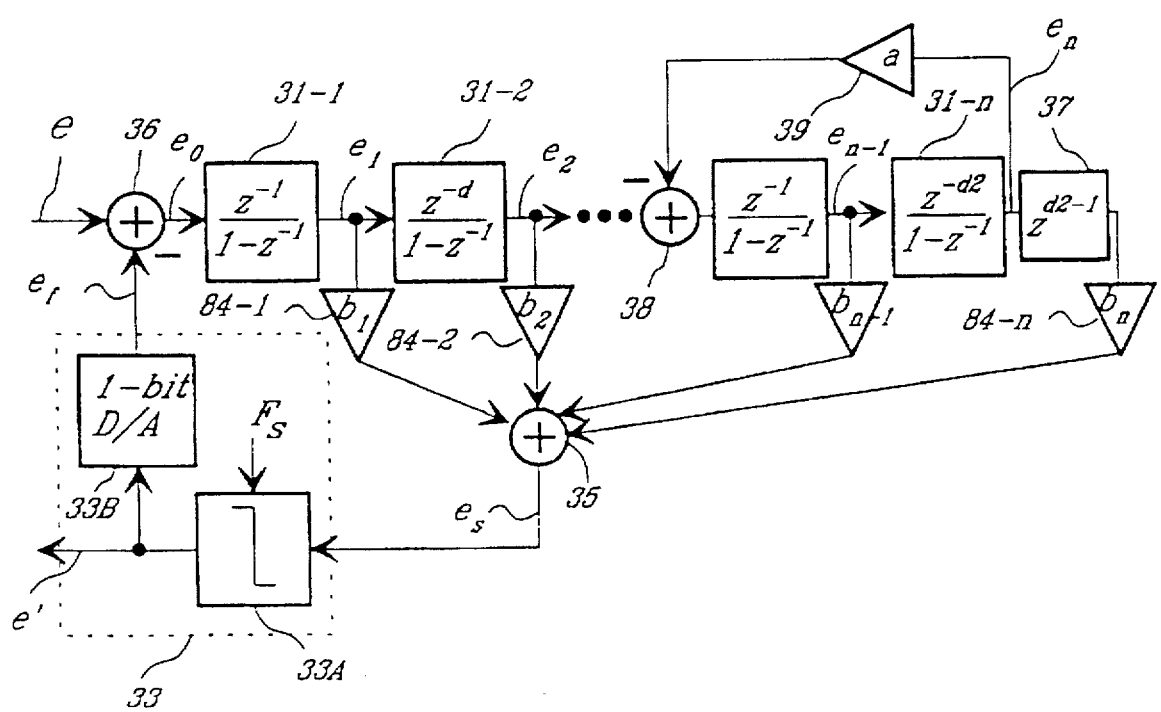
FIG. 3 is a block diagram illustrating an nth-order feedforward modulator suitable for use as a modulator block SD2 in FIG. 1.

FIG. 3 shows a feedforward-type sigma-delta modulator structure suitable for use as the modulator block SD2. In FIG. 3 the modulator comprises a series connection of a subtractor 36 and n integration stages 31-1 ... 31-n in this order. The output voltage $e_1$-$e_n$ of each integration stage 31-1 31-n is connected through a respective scaling means 34-1 ... 34-n (each voltage being scaled by a respective coupling coefficient b1-bn) to a summing means 35. The output voltage of the last integration stage 31-n is connected to the summing means 35 through a delay block 37 connected in series with the scaling means 34-n. The delay $z^{-(1-d2)}$ of the delay block 37 is zero when the delay d2 of the integration stage 31-n is one, and $z^{-1}$ when the delay of the integration stage 31-n is unequal to 1 (d2=0). The summing means 35 combines the scaled voltages $e_1$-$e_n$ and applies the sum voltages to a quantizer 33. The quantizer 33 is a combination of an A/D and a D/A converter, in which the analog voltage es is converted by the A/D converter 33A into a discrete digital value e', which is the output signal of the modulator SD2 and which is immediately thereafter converted back to an analog voltage ef (value) by the D/A converter 33B so as to establish a negative feedback from the output of the quantizer 33 to the input of the modulator SD2. For this purpose the quantized output signal e', that is, the signal estimate is converted into an analog voltage ef by the D/A converter 33B and applied to one input in the subtractor 36 to be subtracted from the input voltage e of the integration stage 31-1. The output of the quantizer 33 gives a quantized error signal e' which is applied to the differentiator block 3 shown in FIG. 1.

If the transmission zeros of the noise function of the modulator are to be transferred from the zero frequency, the output voltage $e_n$ of the integration stage 31-n is feedbacked through a scaling means 39 having a feedback coefficient "a" to a subtractor 38 in the input of the preceding integration stage 31-(n-1) to be subtracted from the input voltage of the integration stage. The subtractor 38 is, of course, omitted if the feedback is not provided. The transfer of the transmission zeros from the zero frequency imposes a few additional requirements on the blocks SD1 and SD2. The integrators of the modulator blocks SD1 and SD2 have to be delayed (generally a delay of at least two clock periods in the outermost modulator feedback loop of the quantized value, including the integrator delays; and a delay of one or two clock periods for the feedback "a", including the integrator delays) in order that the block SD2 could produce a transmission zero in the noise function. If the feedback loop "a" comprises one delay, the transmission zero will be positioned accurately on the unit circle of the z domain, and infinite attenuation will be obtained at this point. On the contrary, if the feedback loop "a" comprises two delays, the transmission zero will be positioned on a line which is tangent to the unit circle at a point (1, 0) so that an absolutely accurate transmission zero is obtained at this point only; the zeros, however, are positioned so close to the circumference of the unit circle at oversampling ratios greater than 64 that there is no significant difference in the amount of quantizing noise on the signal band as compared with the accurate zero. If the order n of the modulator blocks SD1 and SD2 is higher than or equal to 3, the modulator block SD2 has to comprise at least two delayed integration stages to achieve the transmission zero.

The figures and the description related to them are only intended to illustrate the present invention. In its details, the modulator system according to the invention may vary within the scope and spirit of the attached claims.

We claim:

1. A method of cascading at least two feedforward sigma-delta modulators, comprising the steps of:

producing an integrated signal estimate of a primary signal, in a first feedforward sigma-delta modulator;

producing an integrated signal estimate error associated with said integrated signal estimate;

quantizing the integrated signal estimate error, in a second feedforward sigma-delta modulator;

differentiating the quantized error; and subtracting the differentiated quantized error from the integrated signal estimate.

2. A method according to claim 1, wherein said error comprises an output signal of a last integration stage of the first feedforward sigma-delta modulator.

3. A method according to claim 1 wherein said step of producing an integrated signal estimate error is preceded by the steps of:

scaling the integrated signal estimate by a predetermined scaling coefficient; and subtracting the scaled integrated signal estimate from the output signal of the last integration stage of the first feedforward sigma-delta modulator.

4. A feedforward sigma-delta modulator system comprising:

a first feedforward sigma-delta modulator which integrates and quantizes a primary signal, said first feedforward sigma-delta modulator including:

at least two integration stages, each of said integration stages having an associated output signal;

quantizing means for quantizing said output signals of said integration stages to thereby produce an integrated signal estimate of said primary signal; and means, responsive to said at least two integration stages, for providing an integrated signal estimate error associated with said integrated signal estimate;

a second feedforward sigma-delta modulator, operatively connected to said first feedforward sigma-delta modulator, which integrates and quantizes said integrated signal estimate error, including:

at least two integration stages, each of said integration stages producing an associated output signal; and quantizing means, responsive to said at least two integration stages, for quantizing said output signals of said integration stages to thereby produce a quantized integrated signal estimate error;

differentiating means, responsive to said second feedforward sigma-delta modulator, for differentiating the quantized integrated signal estimate error, said differentiating means having a transfer function substantially equal to the inverse function of a common transfer function of said at least two integration stages of said first feedforward sigma-delta modulator;

means, responsive to said first feedforward sigma-delta modulator, for delaying said integrated signal estimate by an amount corresponding to a delay associated with said second feedforward sigma-delta modulator; and means, responsive to said differentiating means and to said means for delaying said integrated signal estimate, for subtracting said differentiated quantized integrated signal estimate error from said delayed integrated signal estimate.

5. A system according to claim 4:

wherein said first feedforward sigma-delta modulator comprises:

scaling means, responsive to said at least two integration stages, for scaling the output signals of each of said at least two integration stages; and summing means for suffering the scaled output signals;

wherein said quantizing means comprises means, responsive to said summing means, for quantizing the summed scaled output signals; and wherein said first feedforward sigma-delta modulator further comprises means, responsive to said quantizing means, for negatively feeding back said quantized summed scaled output voltages to a first integration stage of said at least two integration stages.

6. A system according to claim 5, wherein said integrated signal estimate error comprises an output signal of a last integration stage of said at least two integration stages of said first feedforward sigma-delta modulator.

7. A system according to claim 4 wherein said first feedforward sigma-delta modulator comprises:

second scaling means responsive to said quantizing means of said first feedforward sigma-delta modulator, for scaling said integrated signal estimate; and subtracting means, responsive to said second scaling means and to a last integration stage of said at least two integration stages of said first feedforward sigma-delta modulator, for subtracting the scaled integrated signal estimate from the output signal of said last integration stage so as to provide said integrated signal estimate error.

8. A system according to claim 7, wherein said second feedforward sigma-delta modulator comprises:

means for negatively feeding back an output signal of at least one integration stage of said at least two integration stages to a preceding integration stage of said at least two integration stages; and wherein either said at least one integration stage comprises means for delaying a signal input into said at least one integration stage or said preceding integration stage comprises means for delaying a signal input into said preceding integration stage.

9. A system according to claim 7, further comprising:

third scaling means, responsive to said first feedforward sigma-delta modulator, for scaling said integrated signal estimate error by a first scaling coefficient smaller than one; and fourth scaling means, responsive to said differentiating means, for scaling the quantized integrated signal estimate error by a second scaling coefficient substantially equal to the reciprocal of said first scaling coefficient.

* * * * *

UNITED STATES PATENT AND TRADEMARK OFFICE
CERTIFICATE OF CORRECTION

PATENT NO. : 5,629,701
DATED : May 13, 1997
INVENTOR(S) : Tapani Ritoniemi, et al It is certified that error appears in the above-identified patent and that said Letters Patent is hereby corrected as shown below:

Column 2, line 21, omit "1-bit".

Column 3, line 57, "z⁻1" should be -- $z^{-k}$ --.

Column 4, line 19, "interations" should be -- integration --.

Column 5, line 17, "31-1 31-n" should be -- 31-1...31-n --.

Column 5, line 24, "z⁻1" should be -- $z^{-1}$ --.

Column 5, line 27, "voltages" should be -- voltages --.

IN THE CLAIMS:

Column 7, line 14, "suffering" should be -- summing --.

Signed and Sealed this

Ninth Day of September, 1997

Attest:

BRUCE LEHMAN

*Attesting Officer*     *Commissioner of Patents and Trademarks*